(12) United States Patent
Pang et al.

(10) Patent No.: US 10,181,434 B1
(45) Date of Patent: Jan. 15, 2019

(54) LEAD FRAME FOR INTEGRATED CIRCUIT DEVICE HAVING J-LEADS AND GULL WING LEADS

(71) Applicant: NXP USA, INC., Austin, TX (US)

(72) Inventors: Xingshou Pang, Tianjin (CN); Jinzhong Yao, Tianjin (CN); Zhigang Bai, Tianjin (CN); Meng Kong Lye, Shah Alam (MY)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/922,923

(22) Filed: Mar. 16, 2018

(30) Foreign Application Priority Data

Nov. 28, 2017 (CN) .......................... 2017 1 1209729

(51) Int. Cl.
*H01L 23/495* (2006.01)
*H01L 21/683* (2006.01)
*H01L 23/31* (2006.01)

(52) U.S. Cl.
CPC .... *H01L 23/49541* (2013.01); *H01L 21/6836* (2013.01); *H01L 23/3107* (2013.01)

(58) Field of Classification Search
CPC ........... H01L 23/49541; H01L 23/3107; H01L 21/6836
USPC ......... 361/761; 174/264; 257/669, 670, 676, 257/415; 438/51
See application file for complete search history.

(56) References Cited

U.S. PATENT DOCUMENTS

| | | | |
|---|---|---|---|
| 5,406,119 A | 4/1995 | Numada | |
| 5,594,234 A | 1/1997 | Carter, Jr. et al. | |
| 6,220,765 B1 * | 4/2001 | Tatoh | H01L 31/0203 257/E31.117 |
| 6,674,154 B2 | 1/2004 | Minamio et al. | |
| 7,211,471 B1 | 5/2007 | Foster | |
| 8,525,311 B2 | 9/2013 | Bai et al. | |
| 8,859,339 B2 | 10/2014 | Bai et al. | |
| 8,901,721 B1 | 12/2014 | Bai et al. | |
| 9,190,351 B2 | 11/2015 | Bai et al. | |
| 2006/0220191 A1 * | 10/2006 | Sundstrom | H01L 23/49541 257/669 |
| 2008/0093118 A1 * | 4/2008 | Takahashi | H05K 3/4691 174/264 |
| 2013/0292815 A1 * | 11/2013 | Tashiro | H01L 23/495 257/676 |
| 2015/0014793 A1 * | 1/2015 | Yow | H01L 29/84 257/415 |
| 2016/0128181 A1 * | 5/2016 | Yamada | H05K 1/0271 361/761 |

(Continued)

*Primary Examiner* — Bo Fan
(74) *Attorney, Agent, or Firm* — Charles E. Bergere

(57) ABSTRACT

A lead frame for a packaged integrated circuit (IC) device has alternating first and second leads that protrude from a package body in respective first and second planes, where the second plane is parallel to and below the first plane. The first leads are formed into Gull Wing shaped leads and the second leads are formed into J-shaped leads. Inner lead portions of the first and second leads are maintained in the first plane with a tape. An inner lead portion of each of the second leads includes a deformation area that facilitates maintaining the tape in contact with the inner lead area of the second leads, even when a mold tool presses down on an outer lead side of the second leads to place the outer lead ends of the second leads in the second plane.

16 Claims, 5 Drawing Sheets

(56) References Cited

U.S. PATENT DOCUMENTS

2016/0284632 A1* 9/2016 Shinohara ............ H01L 23/3121
2017/0110341 A1* 4/2017 Onoda .................... H01L 24/33

* cited by examiner

LEAD FRAME FOR INTEGRATED CIRCUIT DEVICE HAVING J-LEADS AND GULL WING LEADS

BACKGROUND

The present invention relates to integrated circuit (IC) packaging, and more particularly to a lead frame for an integrated circuit device having both J-leads and Gull Wing leads.

FIG. 1 is a side view of a portion of a semiconductor device 10 comprising a plastic body 12 that houses one or more integrated circuits, and a plurality of leads projecting from a side thereof, where two such leads 14 and 16 are shown. The plastic body 12 protects the integrated circuitry, while the leads allow for external electrical connection to the integrated circuitry. In order to allow adjacent leads to be located close together (i.e., to reduce lead pitch), and therefore have more leads spaced around the body 12, some of the leads, like the lead 14, are bent outward, and other ones of the leads are bent inward, like lead 16. The outward bending leads are known as Gull Wing leads and the inward bending leads are known as J-leads.

FIG. 2 is a top plan view of a lead frame 20 used to assemble the integrated circuit device 10 of FIG. 1. The lead frame 20 comprises a generally rectangular die pad 22 surrounded by a plurality of leads 24. As noted above, the leads 24 are very close to one another. To prevent the leads from bending or contacting with adjacent leads, tape 26 is placed over the leads to hold them in place. Referring again to FIG. 1, it can be seen that the Gull Wing leads 14 extend from the side of the package body 12 at a different plane than the J-leads 16. Referring now to FIG. 3, during a molding process in which the plastic body 12 is formed, a portion 30 of the mold tooling 30 presses on an outer lead portion close to an inner lead portion of the leads 24 that will be formed into J-leads 16 so that the Gull Wing leads 14 and the J-leads 16 will be vertically spaced from each other, while an outer area of the outer lead portion of the leads 24 is clamped with another portion 32 of the mold tooling. Unfortunately, this pressing and lead deformation can cause the tape 26 to separate from the leads 24, as shown in the lower half of FIG. 3. Accordingly, a minimum lead pitch requirement may be violated or worse yet, one of the J-leads 16 may contact an adjacent Gull Wing lead 14, causing an electrical short circuit. Accordingly, it would be advantageous to have a lead frame and/or a method of preventing such a rule violation or short circuit condition.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides an article of manufacture, which is a lead frame for assembling an integrated circuit device having both J-leads and Gull Wing leads. The lead frame includes a central die receiving area configured for receiving an integrated circuit die, a plurality of first leads surrounding the die receiving area and extending outwardly therefrom, and a plurality of second leads surrounding the die receiving area and extending outwardly therefrom. The plurality of second leads are interleaved with the plurality of first leads. The pluralities of first and second leads lie in a first plane. Each lead of the pluralities of first and second leads has an inner lead area proximate to and spaced from the die receiving area that is configured for connection to an I/O pad of an integrated circuit die disposed in the die receiving area, and an outer lead area that is distal to the die receiving area that allows for an external connection to the integrated circuit die. Each of the second leads includes a deformation area disposed in the inner lead area proximate to the outer lead areas. The deformation area facilitates maintaining the remainder of the inner lead area in the first plane when a force from a mold tool presses a portion of the outer lead area proximate to the inner lead area downwards.

Figure 2:
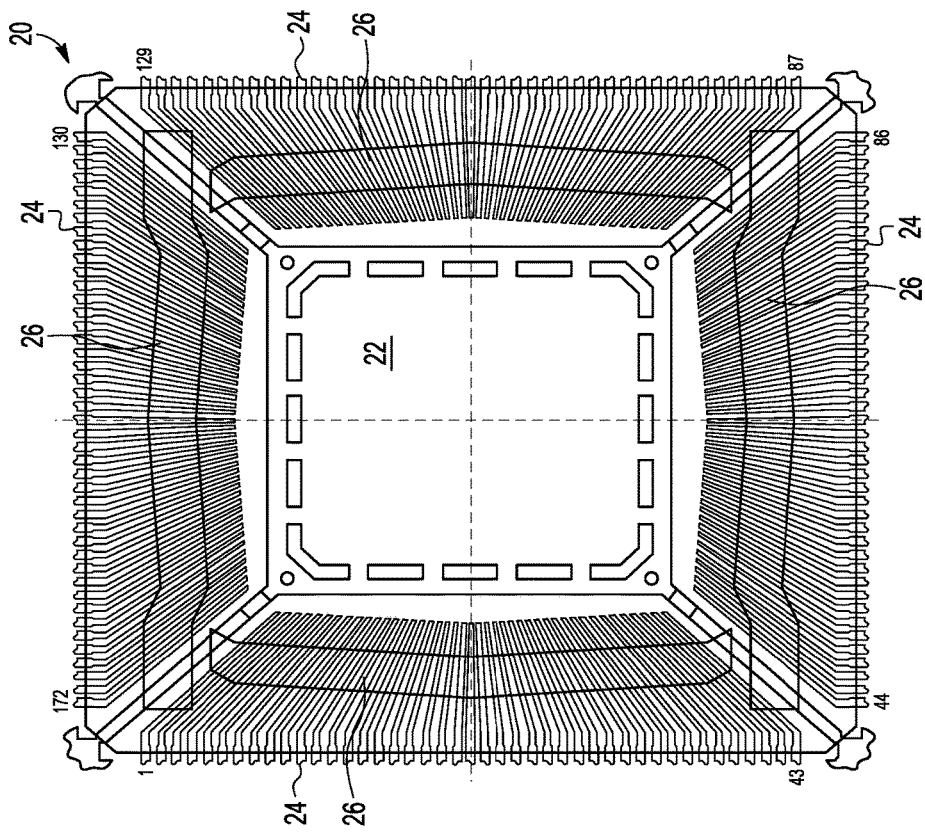
FIG. 2 is an enlarged top plan view of a lead frame of the conventional integrated circuit device of FIG. 1.
Figure 4:
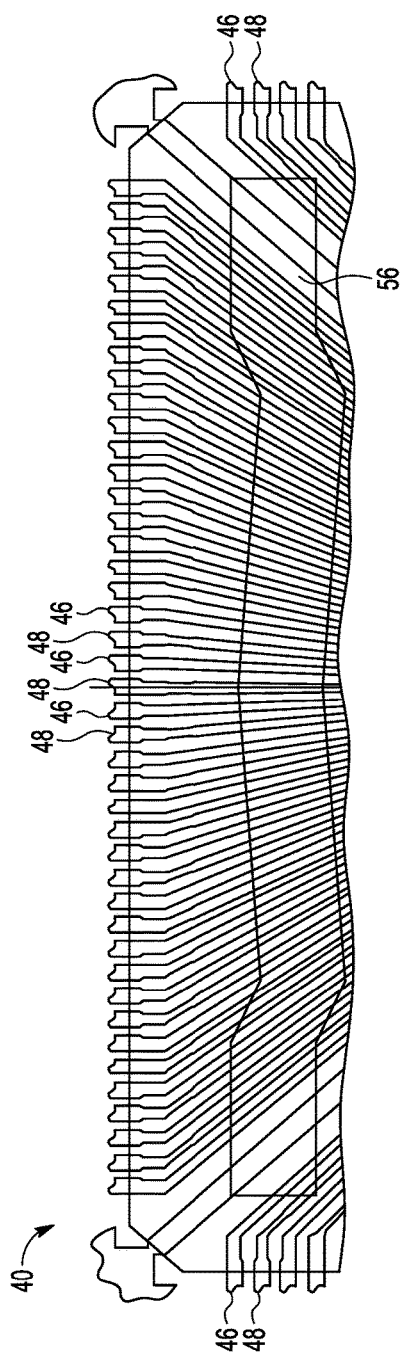
FIG. 4 is an enlarged top plan view of a portion of a lead frame in accordance with an embodiment of the present invention.
Figure 5:
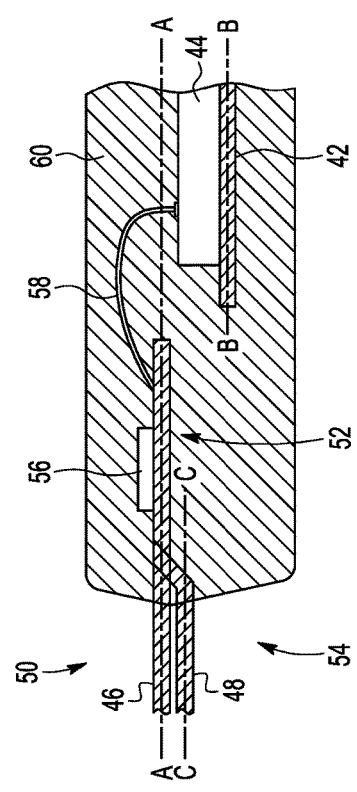
FIG. 5 is an enlarged cross-sectional side view of a portion of a packaged integrated circuit in accordance with an embodiment of the present invention.

Referring now to FIGS. 4 and 5, FIG. 4 is a plan view of a portion of a lead frame 40, and FIG. 5 is a cross-sectional side of a portion of a QFP (Quad Flat Package) 50, in accordance with one embodiment of the invention. The lead frame 40 is similar to the lead frame 20 shown in FIG. 2. The lead frame 40 comprises a central die receiving area 42 configured for receiving at least one integrated circuit die 44. In the presently preferred embodiment, the die receiving area comprises a die pad and the integrated circuit die 44 has a bottom surface attached to the die pad. The lead frame 40 has a plurality of first leads 46 surrounding the die receiving area 42 and extending outwardly therefrom. The lead frame also includes a plurality of second leads 48 surrounding the die receiving area 42 and extending outwardly therefrom. In the presently preferred embodiment, the second leads 48 are interleaved with the first leads 46. In one embodiment, the die receiving area 42 has four sides and each side thereof has one fourth of the plurality of first and second leads 46 and 48 spaced from, but extending away therefrom.

The lead frame 40 may be formed of copper or other conductive metals, as is known in the art, and may be supplied in either strip or array form. The lead frame 40 or just selected portions of the lead frame 40, like outer lead areas of the leads 46 and 48, may be coated or plated with another metal or alloy to inhibit corrosion when the lead frame is exposed to the ambient environment.

Figure 6:
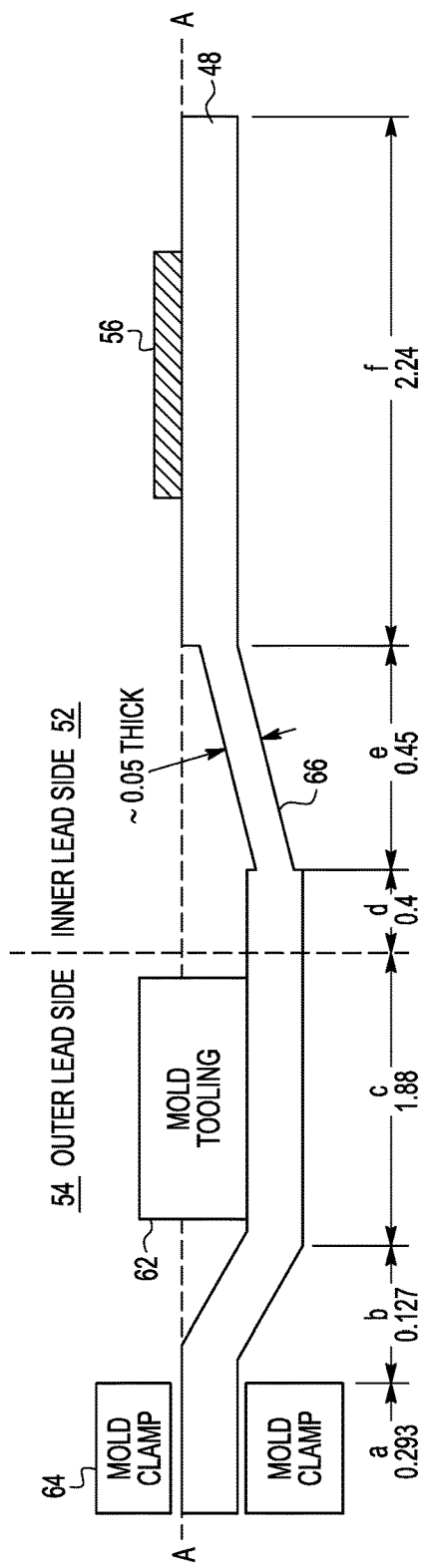
FIG. 6 is an enlarged side view of a lead of the lead frame of FIG. 4 during assembly of the integrated circuit device of FIG. 5.

As will be shown in more detail in FIG. 6, each lead of the pluralities of first and second leads 46 and 48 has an inner lead area 52 that is proximate to, but spaced from, the die receiving area 42, and an outer lead area 54 that is distal to the die receiving area 42. The inner lead areas 52 are configured for connection to an I/O pad of the integrated circuit die 44, while the outer lead areas 54 allow for external connections to the integrated circuit die 44.

A tape 56 is placed over a top surface of the inner lead areas 52 of the first and second pluralities of leads 46 and 48. The purpose of the tape 52 is to keep the first and second leads 46 and 48 separate from each other, and also to maintain at least the inner lead areas 52 of the first and second pluralities of leads 46 and 48 in a first plane, which is denoted by A-A in FIG. 5. The tape 56 may comprise a tape with a polyimide film and a silicone adhesive that has good strength and flexibility, and is heat resistant. Such tapes are known and commercially available.

As previously noted, the inner lead areas 52 are configured for connection to an I/O pad of the integrated circuit die 44. A plurality of interconnections electrically connect bonding pads disposed on a top surface of the integrated circuit die 44 with the inner lead areas 52 of the first and second pluralities of leads 46 and 48, and in the presently preferred embodiment, the plurality of interconnections comprises bond wires 58. The bond wires 58 are attached at one end to the bonding pads of the integrated circuit die 44 and at the other end to the inner lead areas 52 of the leads 46 and 48. However, other interconnection methods are possible, such as having the leads 46 and 48 directly contact the die bonding pads.

A mold compound 60 covers the integrated circuit die 44, the bond wires 58, and the inner lead areas 52 of the first and second leads 46 and 48. The mold compound 60 defines a package body. The outer lead areas 54 of the leads 46 and 48 extend outwardly from the mold compound 60 and allow for external electrical communication with the die 44.

Figure 1:
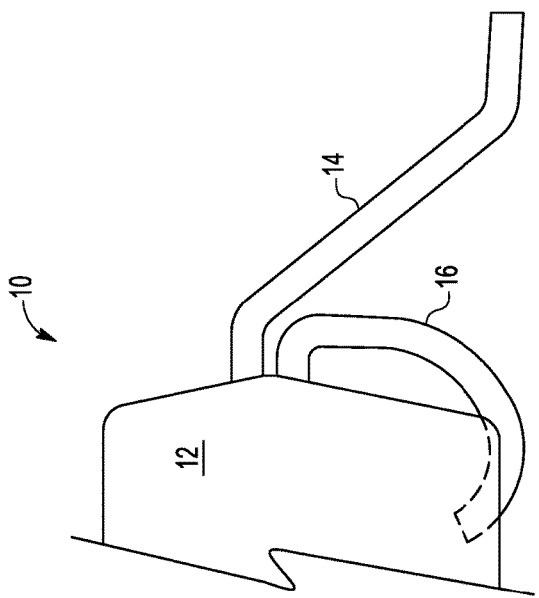
FIG. 1 is an enlarged side view of a portion of a conventional integrated circuit device that has both J-leads and Gull Wing leads.
Figure 3:
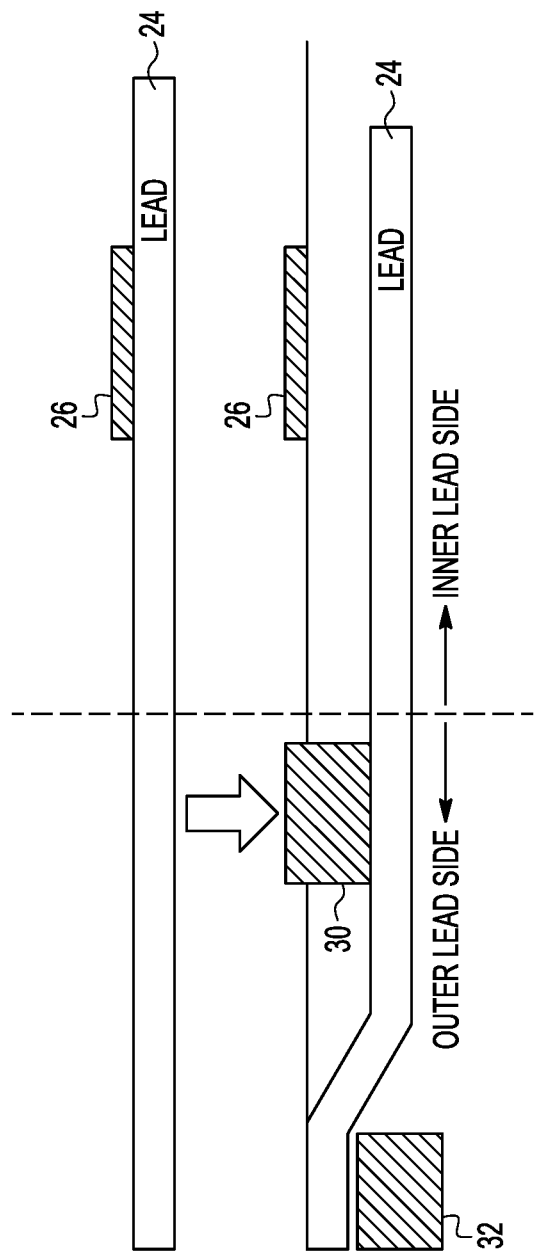
FIG. 3 is an enlarged side view of a lead of the lead frame of FIG. 2 during assembly of the conventional integrated circuit device of FIG. 1.

Relative to the first plane A-A, at least in the final package 50, in the presently preferred embodiment, the die pad 42 lies in a second plane, denoted by B-B, that is parallel to and below the first plane A-A. As will be discussed in more detail below, the outer lead areas 54 of the second leads 48 lie in a third plane, denoted by C-C, that is parallel to and lies between the first and second planes. Thus, the plurality of first leads 46 extend outwardly from the package body in the first plane A-A, and the plurality of second leads 48 extend outwardly from the package body in the third plane C-C that is parallel to and between the first and second planes A-A and B-B. As shown in FIG. 1, in the present invention, the first leads 46 are formed into a Gull Wing shape, and the second leads 48 are formed into a J-lead shape.

Referring now to FIG. 6, a greatly enlarged side view of one of the leads 48 is shown. During assembly of the packaged device 50, an assembly comprising the lead frame 40, die 44, and bond wires 58 is placed in a mold tool to encapsulate the assembly with the mold compound 60. The mold tool includes a tooth 62 and a clamp 64. In order to locate the outer lead areas 54 of the first and second leads 46 and 48 in spaced, parallel planes A-A and C-C, the tooth 62 presses down on the second leads 48, while the clamp 64 firmly holds the distal end of the outer lead portion 54. In FIG. 6, the inner lead side 52 denotes the portion of the lead 48 that will be covered with mold compound and the outer lead side 54 denotes the portion of the lead 48 that will project outwardly from the mold compound. Thus, the lead 48 comprises the inner lead area 52 and the outer lead area 54. The tape 56 is located on a top surface of the inner lead area 52, and a bond wire (not shown in FIG. 6) will have one end attached to the lead 48 on the end of the lead proximate to the die pad (i.e., to the right of the tape 56).

Each of the second leads 48 includes a deformation area 66 disposed in the inner lead area 52 proximate to the outer lead area 54. The deformation area 66 facilitates maintaining the remainder of the inner lead area 52 in the first plane A-A when the force exerted on the lead 48 from the tooth 62 of the mold tool presses a portion of the outer lead area proximate to the inner lead areas downwards. That is, the deformation area 66 prevents the tape 56 from separating from the inner lead area 52 of the second lead 48.

In one embodiment, the deformation area 66 comprises a tapered portion of the lead 48 that extends from one end of the inner lead area 52 to near to the outer lead area 54. For example, a thickness of the deformation area 66 may be about one-half of the thickness of the rest of the lead 48. In one example, the lead 48 has a thickness of 0.127 mm (5 mils), and the deformation area 66 has a thickness of 0.05 mm. In FIG. 6, the lead 48 is divided into several regions labeled "a" through "f" to provide example dimensions of one embodiment of a lead 48. Thus, in one example embodiment, "a"=0.293 mm, "b"=0.127 mm, "c"=1.88 mm, "d"=0.4 mm, "e"=0.45, f=2.24 mm, and the lead 48 has a thickness and a width each of 0.127 mm, except at the deformation area 66, which has an altered thickness and/or width, as described in more detail with FIGS. 7-9.

Figure 7:
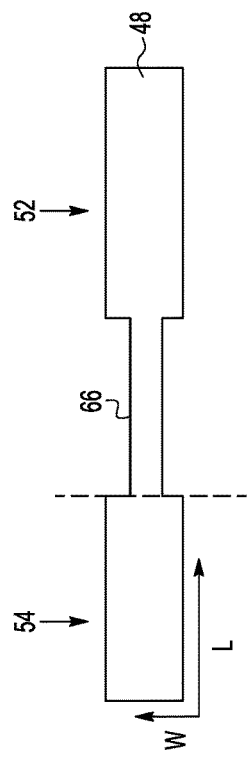
FIG. 7 is an enlarged top plan view of a deformation area of a lead of the lead frame of FIG. 4 in accordance with an embodiment of the present invention.

FIG. 7 is an enlarged top plan view of one embodiment of the deformation area 66 of the second lead 48 of the lead frame 40 of FIG. 4 in accordance with an embodiment of the present invention. The deformation area 66 comprises a tapered or thinned section of the lead 48, such that a width of the deformation area 66 is less than a width of the other areas of the lead 48. In the embodiment shown in FIG. 7, the deformation area 66 is formed by etching both lateral sides of the lead 48 at the designated area. The etching may comprise either wet or dry etching. Alternatively, the deformation area 66 may be formed by stamping. While the width of the deformation is less than the width of the other areas of the lead 48, the thickness of the deformation area 66 may be the same or less than the thickness of the remainder of the lead 48. In one exemplary embodiment, the first width (i.e., the width of the non-tapered portions) is about 0.127 mm and the second width (i.e., the width of the deformation area 66) is about 0.05 mm.

Figure 8:
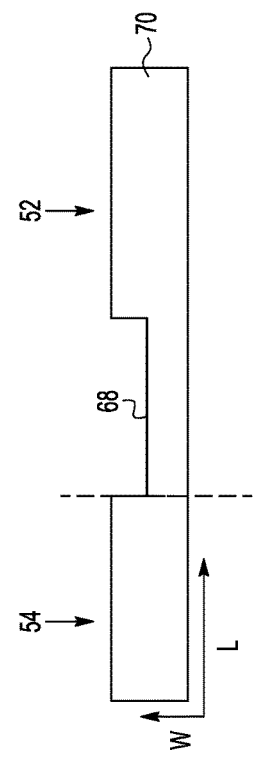
FIG. 8 is an enlarged top view of a deformation area of a lead of a lead frame in accordance with another embodiment of the present invention.

FIG. 8 is an enlarged top view of a deformation area 68 of a lead 70 of a lead frame in accordance with another embodiment of the present invention. In this embodiment, one side of the lead 70 at the deformation area 68 has been reduced in width, such that a width of the deformation area 68 is about half or less than a width of the remaining portions of the lead 70. In this embodiment, although the width of the lead 70 has been reduced at the deformation area 68, the thickness of the deformation area 68 has not been reduced.

Figure 9:
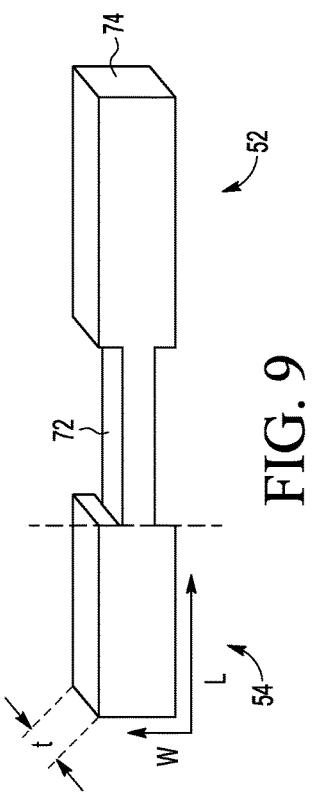
FIG. 9 is an enlarged side perspective view of a deformation area of a lead of a lead frame in accordance with another embodiment of the present invention.

FIG. 9 is an enlarged side perspective view illustrating a deformation area 72 of a lead 74 in accordance with an embodiment of the present invention. In this embodiment, the deformation area 72 has both a reduced width and a reduced thickness as compared to the remaining areas of the lead 74. In this embodiment, the width and thickness both have been reduced by half or more of the width and thickness of the remaining portions of the lead 74.

It now should be apparent that the present invention comprises a lead frame for a dual row QFP, and a dual row QFP incorporating the lead frame. In the dual row QFP, every other lead is bent down and in to form a J-shape lead, while intervening leads are bent down and out into gull-wing shapes and, consequently, edges of adjacent leads that were in close proximity are separated. By including a deformation area in the leads that will be formed into J-leads, when the mold tooling presses on the lead to change the plane at which the lead extends from the package body, the deformation area ensures that the inner lead portion of the lead is not separated from the tape, and thus, the lead remains spaced from adjacent leads. Thus, while the inner lead portions of all of the leads (J-leads and gull-wing leads) lie in the same plane, the outer lead portions of the J-leads lie in plane that is parallel to and below the plane of the gull-wing leads. Maintaining the inner lead portions of all of the leads in the same plane facilitates wire bonding.

The sides of the package body may be crenellated with recesses or crenels to receive the ends of the J-leads. The bottom of the package body may have perpendicular channels along the sides to receive the ends of the J-shaped leads.

Embodiments of the invention have been described where the edges of the recesses are linear segments in a plan view, where the recess edges may run parallel to, or be at an angle to, the edges of the corresponding inner lead. In alternative embodiments, the edges of the recess are non-linear curves. In these embodiments, a lead webbing similarly extends from an edge of a lead to the near edge of the recess and from the back of the recess to a distal edge of the webbing that is not further than the top elbow of the corresponding lead. In other words, the lead webbing may extend as far as the exposed flat segment of the corresponding lead extends.

An embodiment of the invention has been described where the exposed portions of the leads have one or more bends in them to form j-shaped or gull-wing-shaped leads. In some alternative embodiments of the invention, the exposed portions have no bends in them and extend straight out from the case to form flat leads. An embodiment of the invention has been described where inner and outer leads alternate on all sides of an IC device. In some alternative embodiments of the embodiment, leads may be placed along some, but not all, sides of an IC device.

Embodiments of the invention have been described having particular dimensions defined. In alternative embodiments, the dimensions may vary beyond the described dimension ranges. It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The invention claimed is:

1. An article of manufacture, comprising:
   a central die receiving area configured for receiving at least one integrated circuit die;
   a plurality of first leads surrounding the die receiving area and extending outwardly therefrom;
   a plurality of second leads surrounding the die receiving area and extending outwardly therefrom, wherein the plurality of second leads are interleaved with the plurality of first leads;
   wherein the pluralities of first and second leads lie in a first plane;
   wherein each lead of the pluralities of first and second leads has an inner lead area proximate to and spaced from the die receiving area that is configured for connection to an I/O pad of an integrated circuit die disposed in the die receiving area, and an outer lead area that is distal to the die receiving area that allows for an external connection to the integrated circuit die; and
   wherein each of the second leads includes a deformation area disposed in the inner lead area proximate to the outer lead areas, wherein the deformation areas facilitate maintaining the remainder of the inner lead areas in the first plane as a force from a mold tool presses a portion of the outer lead areas proximate to the inner lead areas downwards.

2. The article of manufacture of claim 1, further comprising a tape placed over a top surface of the inner lead areas of the first and second pluralities of leads that maintains the first and second pluralities of leads in the first plane.

3. The article of manufacture of claim 2, wherein the deformation area prevents the tape from separating from the inner lead areas of the second leads.

4. The article of manufacture of claim 2, wherein the die receiving area comprises a die pad located in a second plane that is parallel to and below the first plane.

5. The article of manufacture of claim 4, further comprising an integrated circuit die having a bottom surface attached to the die pad.

6. The article of manufacture of claim 5, further comprising a plurality of interconnections that electrically connect bonding pads disposed on a top surface of the integrated circuit die with the inner lead areas of the first and second pluralities of leads.

7. The article of manufacture of claim 6, wherein the plurality of interconnections comprises bond wires.

8. The article of manufacture of claim 6, further comprising a mold compound that covers the integrated circuit die, the plurality of interconnections, and the inner lead areas of the pluralities of first and second leads, wherein the mold compound defines a package body.

9. The article of manufacture of claim 8, wherein the plurality of first leads extend outwardly from the package body in the first plane, and the plurality of second leads extend outwardly from the package body in a third plane that is parallel to and between the first and second planes.

10. The article of manufacture of claim 9, wherein the plurality of first leads are formed into a Gull Wing shape, and the plurality of second leads are formed into a J-lead shape.

11. The article of manufacture of claim 8, wherein:
the package body has four sides in a plan view;
each side of the package body has one fourth of the plurality of first leads extending therefrom; and
each side of the package body has one fourth of the plurality of second leads extending therefrom.

12. The article of manufacture of claim 1, wherein the deformation areas of the second leads comprise a tapered portion extending from one end of the inner lead portion to the outer lead portion.

13. The article of manufacture of claim 12, wherein the plurality of first and second leads have a first thickness, and the tapered portions that comprise the deformation areas of the second leads have a second thickness that is less than the first thickness.

14. The article of manufacture of claim 13, wherein the first thickness is about 0.127 mm and the second thickness is about 0.05 mm.

15. The article of manufacture of claim 12, wherein the plurality of first and second leads have a first width, and the tapered portions that comprise the deformation areas of the second leads have a second width that is less than the first width.

16. The article of manufacture of claim 15, wherein the first width is about 0.127 mm and the second width is about 0.05 mm.

* * * * *